United States Patent
Lee et al.

(10) Patent No.: US 7,923,379 B2
(45) Date of Patent: Apr. 12, 2011

(54) MULTI-STEP PROCESS FOR FORMING HIGH-ASPECT-RATIO HOLES FOR MEMS DEVICES

(75) Inventors: Jiou-Kang Lee, Zhu-Bei (TW); Ting-Hau Wu, Yilan (TW); Shang-Ying Tsai, Jhongli (TW); Jung-Huei Peng, Jhubei (TW); Chun-Ren Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 187 days.

(21) Appl. No.: 12/347,250

(22) Filed: Dec. 31, 2008

(65) Prior Publication Data

US 2010/0120260 A1  May 13, 2010

Related U.S. Application Data

(60) Provisional application No. 61/113,846, filed on Nov. 12, 2008.

(51) Int. Cl.
*H01L 21/31* (2006.01)

(52) U.S. Cl. ............ 438/763; 438/42; 438/53; 257/619; 257/E21.52

(58) Field of Classification Search .................. None
See application file for complete search history.

(56) References Cited

U.S. PATENT DOCUMENTS

| | | | |
|---|---|---|---|
| 5,632,854 A * | 5/1997 | Mirza et al. | 438/53 |
| 6,274,457 B1 * | 8/2001 | Sakai et al. | 438/424 |
| 6,426,239 B1 * | 7/2002 | Gogoi et al. | 438/53 |
| 6,568,794 B2 | 5/2003 | Yamanaka et al. | |
| 7,131,715 B2 | 11/2006 | Silverbrook | |
| 2004/0100532 A1 * | 5/2004 | Silverbrook | 347/57 |
| 2004/0198021 A1 * | 10/2004 | Brouillette et al. | 438/459 |
| 2004/0208751 A1 | 10/2004 | Lazar et al. | |
| 2004/0214112 A1 * | 10/2004 | Cheng et al. | 430/322 |
| 2006/0263717 A1 * | 11/2006 | Lee et al. | 430/270.1 |

OTHER PUBLICATIONS

Bellouard, Y., et al., "Fabrication of High-Aspect Ratio, Micro-Fluidic Channels and Tunnels Using Femtosecond Laser Pulses and Chemical Etching," Optics Express, vol. 12, No. 10, May 17, 2004, pp. 2120-2129.

* cited by examiner

*Primary Examiner* — Thanh V Pham
*Assistant Examiner* — Andres Munoz
(74) *Attorney, Agent, or Firm* — Slater & Matsil, L.L.P.

(57) ABSTRACT

A method of forming an integrated circuit structure includes forming an opening in a substrate, with the opening extending from a top surface of the substrate into the substrate. The opening is filled with a filling material until a top surface of the filling material is substantially level with the top surface of the substrate. A device is formed over the top surface of the substrate, wherein the device includes a storage opening adjoining the filling material. A backside of the substrate is grinded until the filling material is exposed. The filling material is removed from the channel until the storage opening of the device is exposed.

9 Claims, 8 Drawing Sheets

MULTI-STEP PROCESS FOR FORMING HIGH-ASPECT-RATIO HOLES FOR MEMS DEVICES

This application claims the benefit of U.S. Provisional Patent Application Ser. No. 61/113,846, filed on Nov. 12, 2008, and entitled "A Multi Step Process to Fill Sacrificial Photo Resist in High Aspect Ratio Deep Hole to Form Plat MEMS Device Base," which application is incorporated herein by reference.

TECHNICAL FIELD

This invention relates generally to integrated circuit structure and manufacturing processes, and more particularly to micro-electro-mechanical system (MEMS) devices, and even more particularly to forming channels for MEMS devices.

BACKGROUND

Micro-electro-mechanical systems (MEMS) are gaining increasing attention because of their potential advantages in miniaturization, performance, reliability, environmental endurance, low cost, and mass production capability. Various applications have been developed from MEMS devices. Microphones, bio devices such as micro flow pumps, and micro inkjet heads are among the most commonly seen applications of MEMS devices.

The formation of micro flow pumps and micro inkjet heads often involves forming channels (tunnels) for conducting fluid into or out of the corresponding MEMS devices. FIGS. 1 through 3 illustrate the cross-sectional views of intermediate stages in the formation of a channel. Referring to FIG. 1, MEMS device 4 is first formed on a front surface of substrate 2. In FIG. 2, channel 6 is formed from the backside of substrate 2, for example, by forming photo resist 8 on the back of substrate 2, patterning photo resist 8, and etching substrate 2. MEMS device 4 is exposed through channel 6. Next, as shown in FIG. 3, photo resist 8 is removed. The resulting MEMS device 4 is connected to channel 6.

In the process as shown in FIGS. 1 through 3, the etching of substrate 2 needs to stop when the etchant reaches MEMS device 4. It is thus required that the etching characteristic of MEMS device 4 be different from that of substrate 2, so that the etching selectivity may be high enough. This limits the usable materials and the structures of MEMS device 4, and puts a high accuracy requirement on the etching of substrate 2. Further, etching substrate 2 requires accurate alignment. If channel 6 is not straight, or the position of channel 6 offsets from the desirable position, MEMS device 4 may not be able to function correctly. For example, the fluid in channel 6 may not effectively flow into MEMS device 4. New methods for forming the channels of MEMS devices are thus needed.

SUMMARY OF THE INVENTION

In accordance with one aspect of the present invention, a method of forming an integrated circuit structure includes forming an opening in a substrate, with the opening extending from a top surface of the substrate into the substrate. The opening is filled with a filling material until a top surface of the filling material is substantially level with the top surface of the substrate. A device is formed over the top surface of the substrate, wherein the device includes a storage opening adjoining the filling material. A backside of the substrate is grinded until the filling material is exposed. The filling material is removed from the channel until the storage opening of the device is exposed.

In accordance with another aspect of the present invention, a method of forming an integrated circuit structure includes forming an opening in a substrate, wherein the opening extends from a top surface of the substrate to an intermediated level between the top surface and a bottom surface of the substrate. The opening is filled with a photo resist. A backside of the substrate is grinded until the photo resist is exposed. The photo resist is then removed from the opening.

In accordance with yet another aspect of the present invention, a method of forming an integrated circuit structure includes providing a substrate, and forming an opening in the substrate. The opening extends from a top surface of the substrate into the substrate. The method further includes filling a first layer of a photo resist into the opening; removing a portion of the photo resist on the surface of the substrate; baking the first layer of the photo resist; filling a second layer of the photo resist into the opening and over the first layer of the photo resist; removing an additional portion of the photo resist on the surface of the substrate; and baking the second layer of the photo resist. A micro-electro-mechanical system (MEMS) device is formed over the top surface of the substrate. The MEMS device includes an opening adjoining the first layer of the photo resist. A backside of the substrate is grinded until the photo resist is exposed. The photo resist is then removed from the opening.

In accordance with yet another aspect of the present invention, an integrated circuit structure includes a substrate; and a channel in the substrate, wherein the channel extends from a top surface of the substrate into the substrate. A device over the top surface of the substrate, wherein the device has a storage opening adjoining the channel. The channel has a first portion having a first width closer to the device, and a second portion farther away from the device than the first portion, and wherein the second portion has a second width greater than the first width.

The advantageous features of the present invention include improved accuracy in the alignment of the channels to the corresponding MEMS devices and relaxed requirements to the materials and structures of the MEMS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

A novel method of forming channels for micro-electromechanical system (MEMS) devices is presented. The intermediate stages of manufacturing an embodiment of the present invention are illustrated. The variations and applications of the illustrated embodiment are then discussed. Throughout the various views and illustrative embodiments of the present invention, like reference numbers are used to designate like elements.

Figure 1:
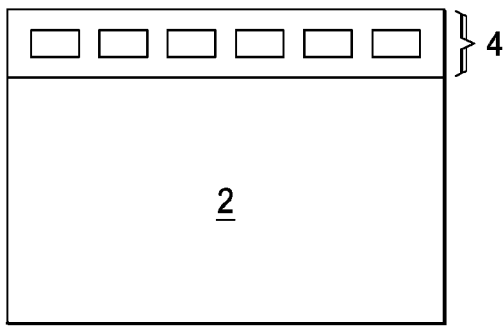
FIGS. 1 through 3 illustrate cross-sectional views of intermediate stages in the formation of a channel connected to a micro-electro-mechanical system (MEMS) device.
Figure 2:
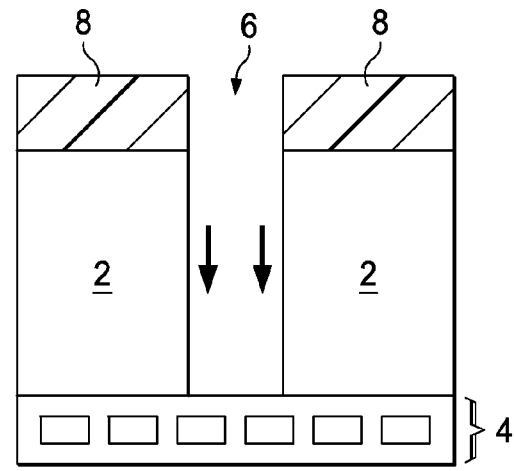
Figure 3:
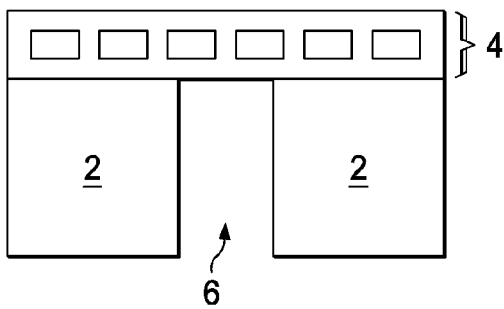
Figure 4A:
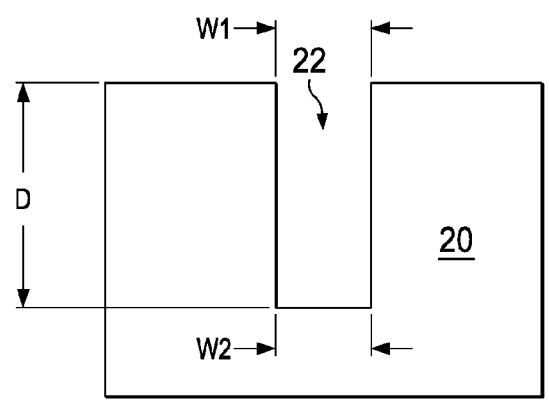
FIGS. 4A through 16 are cross-sectional views of intermediate stages in the manufacturing of an embodiment of the present invention.
Figure 4B:
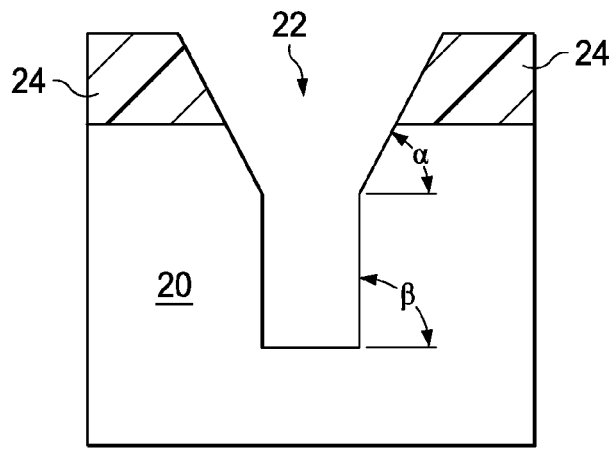

Referring to FIGS. 4A and 4B, substrate 20 is provided. In an embodiment of the present invention, substrate 20 is a semiconductor substrate comprising silicon, germanium, GaAs, and/or other commonly used semiconductor materials. Substrate 20 may be a bulk substrate, or has a semiconductor-on-insulator structure. Opening 22 (referred to as channel 22 hereinafter) is formed in substrate 20, for example, by etching or laser drilling. Channel 22 may have a high-aspect ratio, with a ratio of depth D to width W1 being greater than about 5, and possibly even greater than about 10. Channel 22 does not penetrate substrate 20. Depth D of channel 22 may be greater than about 5 µm, and preferably greater than about 20 µm.

As a nature behavior of the etching process, as shown in FIG. 4A, the sidewalls of channel 22 will not be fully vertical, and the top width W1 of channel 22 will be greater than the bottom width W2. FIG. 4B illustrates another process for tuning the entrance profile of channel 22. In this case, the photo resist 24 that is used for forming channel 22 may be tuned, so that channel 22 will have an entrance profile as shown in FIG. 4B. Alternatively, the etching recipe may be tuned to achieve the enlarged entrance. Assuming the slant angle of the sidewalls of channel 22 at the entrance is α, and the slant angle of the sidewalls of channel 22 at the bottom is β, angle α will be less than β, for example, by greater than about 10 degrees.

Channel 22 is then filled with a photo resist. Since channel 22 has a great aspect ratio, if it is filled with a photo resist in a single filling step, the resulting photo resist is unlikely to fill channel 22 without bubbles. Further, it is difficult to compensate for the contraction of the photo resist during the baking of PR, so that the top surface of the resulting photo resist is substantially level with the top surface of substrate 20. Accordingly, a multi-step filling process is preferably performed, which includes at least two photo-resist filling and baking processes.

Figure 5:
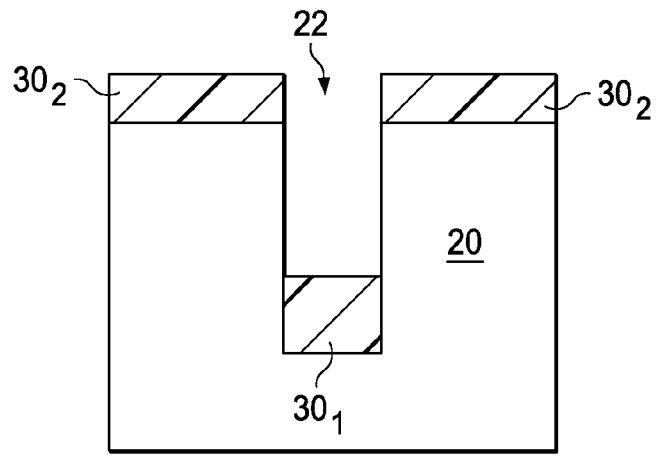
Figure 6:
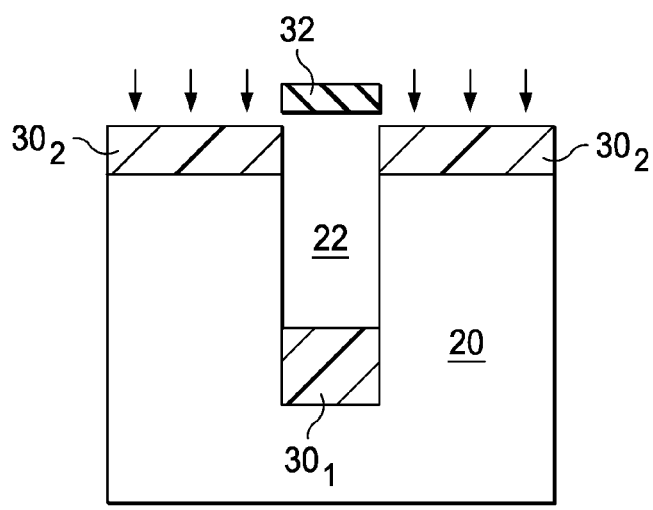
Figure 7:
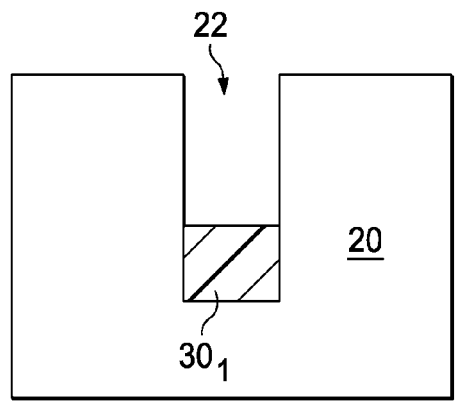

FIGS. 5 through 7 illustrate a first photo-resist filling process. Referring to FIG. 5, photo resist 30 is applied. Photo resist 30 includes portion $30_1$ in channel 22, and portions $30_2$ on the top surface of substrate 20. The amount of photo resist 30 is controlled so that after the subsequent baking of photo resist 30, no excess flow such as bubbles is formed in photo resist 30. Next, as shown in FIG. 6, mask 32, which is the lithography mask comprising transparent portions and opaque portions, is placed over photo resist 30. In an exemplary embodiment, the opaque portion covers channel 22, while portions $30_2$ on the top surface of substrate 20 are covered by the transparent portions. Next, an exposure is performed. Photo resist 30 is then developed so that the exposed portions $30_2$ are removed, while portion $30_1$, which is not exposed, remains in channel 22. The resulting structure is shown in FIG. 7. In alternative embodiments, portion $30_1$ is exposed, while portions $30_2$ are not exposed. In this case, the unexposed portions $30_2$ are removed. A baking is performed to the structure shown in FIG. 7 to harden photo resist portion $30_1$. The temperature and the duration of the baking process depend on the type and the specification of photo resist 30.

Figure 8:
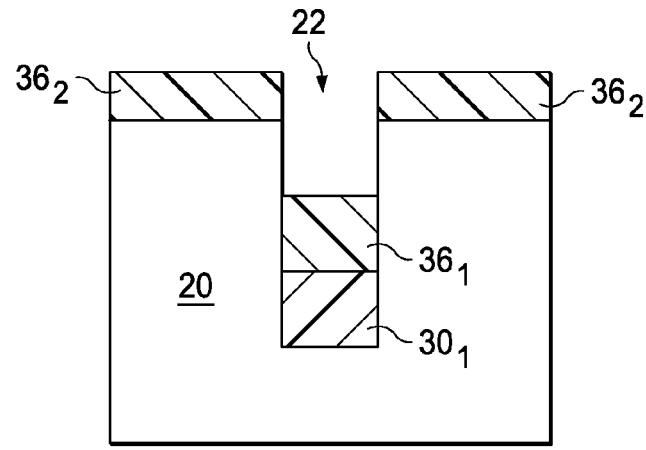
Figure 9:
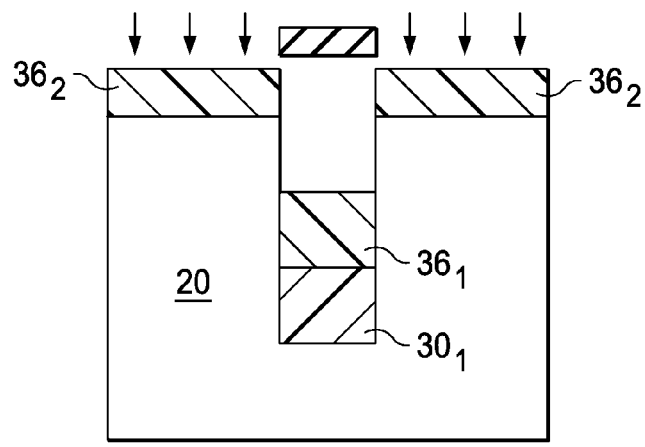
Figure 10:
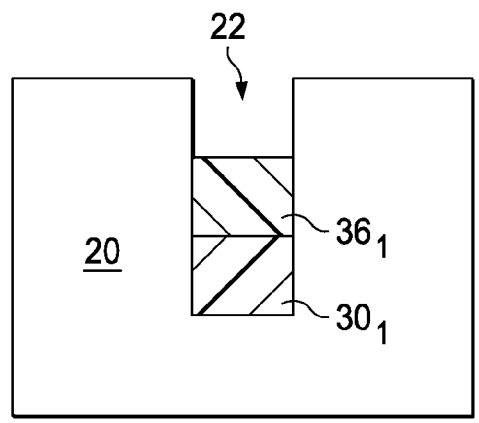

In FIGS. 8 through 10, a second photo-resist filling process is performed, wherein the second photo-resist filling process may be essentially the same as the first photo-resist filling process. Referring to FIG. 8, photo resist 36 is applied. Again, photo resist 36 includes portion $36_1$ in channel 22, and portions $36_2$ on the top surface of substrate 20. Next, as shown in FIG. 9, an exposure is performed, followed by developing photo resist 36 to remove portions $36_2$, while portion $36_1$ remains in channel 22, resulting in the structure as shown in FIG. 10. A baking is then performed to harden photo resist 36.

Figure 11:
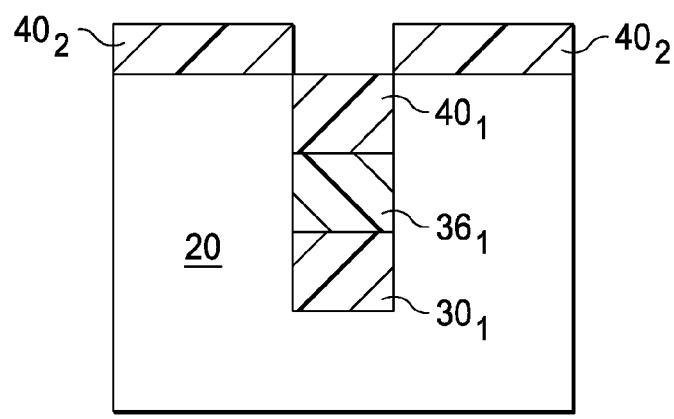
Figure 12:
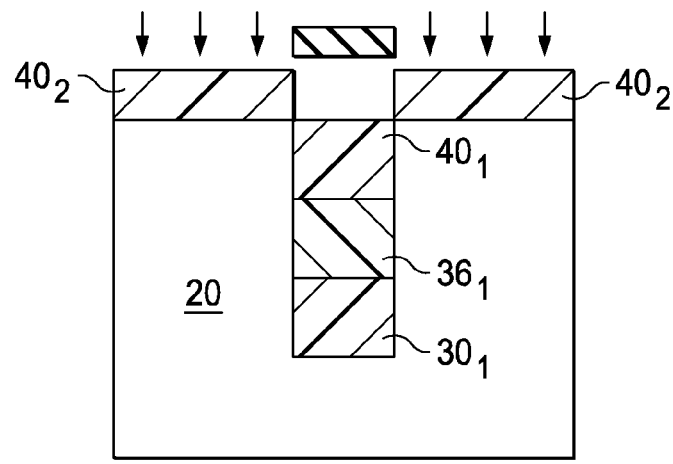
Figure 13:
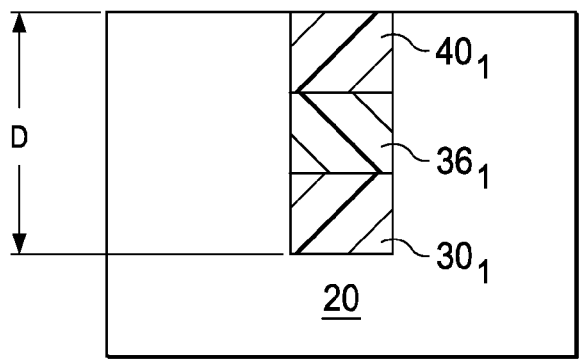

FIGS. 11 through 13 illustrate the third filling and baking of photo resist 40, which leaves portion $40_1$ in channel 22. The details are similar to the first and the second filling processes, and hence are not repeated herein. It is preferred that after the third filling and baking processes, the resulting photo resist portion $40_1$ has a top surface substantially level with, although it may also be slightly higher or lower than, the top surface of substrate 20. To ensure such a result, experiments may be performed to find the optimum amount of photo resist used in each of the filling and baking processes. Further, to ensure the leveling of photo resist to the top surface of substrate 20, a solvent may be added into one or more of the photo resists used in the photo resist filling steps. Particularly, the solvent may be added into the photo resist (photo resist $40_1$ in the illustrated embodiment) used in the last filling and baking process, to reduce the viscosity of the photo resist, so that a thinner layer of photo resist may be applied. However, photo resist $30_1$ and/or $36_1$ may or may not have solvents added herein. In alternative embodiments, different photo resist having different viscosities may be used.

In the above-discussed embodiments, three photo-resist filling and baking processes are used as examples to explain the concept of the present invention. In alternative embodiments, the multi-step filling process may include only two photo-resist filling and baking processes, or more than three photo-resist filling and baking processes, depending on the depth D of channel 22 and/or the type of photo resists. In yet other embodiments, if depth D is small, only one photo-resist filling and baking step is used.

Figure 14:
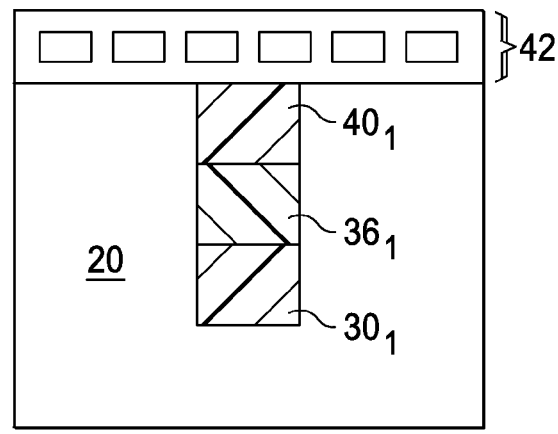

Next, as shown in FIG. 14, MEMS device 42 is formed on substrate 20. In addition, other integrated circuits, such as complementary metal-oxide-semiconductor (CMOS) devices (not shown) may also be formed on the top surface of substrate 20. MEMS device 42 may be a micro flow pump, a micro inkjet head, a microphone, or any other MEMS device having a micro channel therein that needs to be connected to channel 22. The formation details of MEMS device 42 are not discussed herein.

Figure 15:
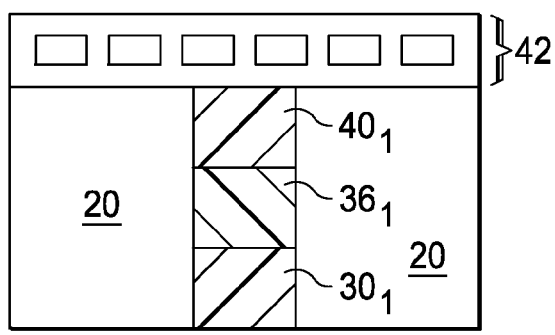

FIG. 15 illustrates the backside grinding of substrate 20, which may be performed by mounting substrate 20 on a blue tape or a glass wafer (not shown), with the front surface (the surface facing up in FIG. 15) attached to the blue tape or the glass wafer. After the grinding, the back surface of photo resist $30_1$ is exposed. The blue tape or the glass wafer may then be removed.

Figure 16:
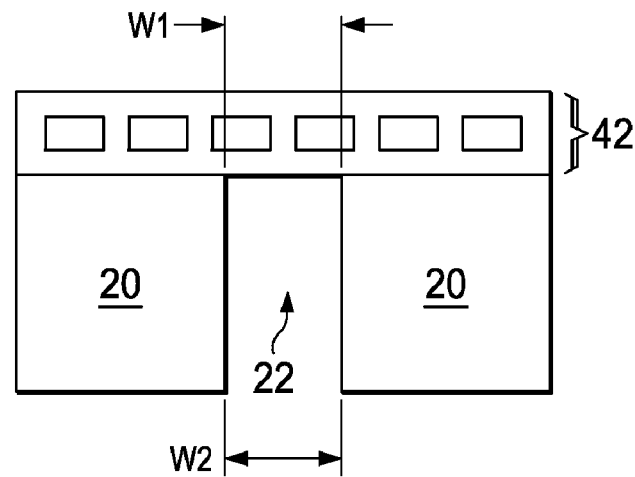
Figure 17:
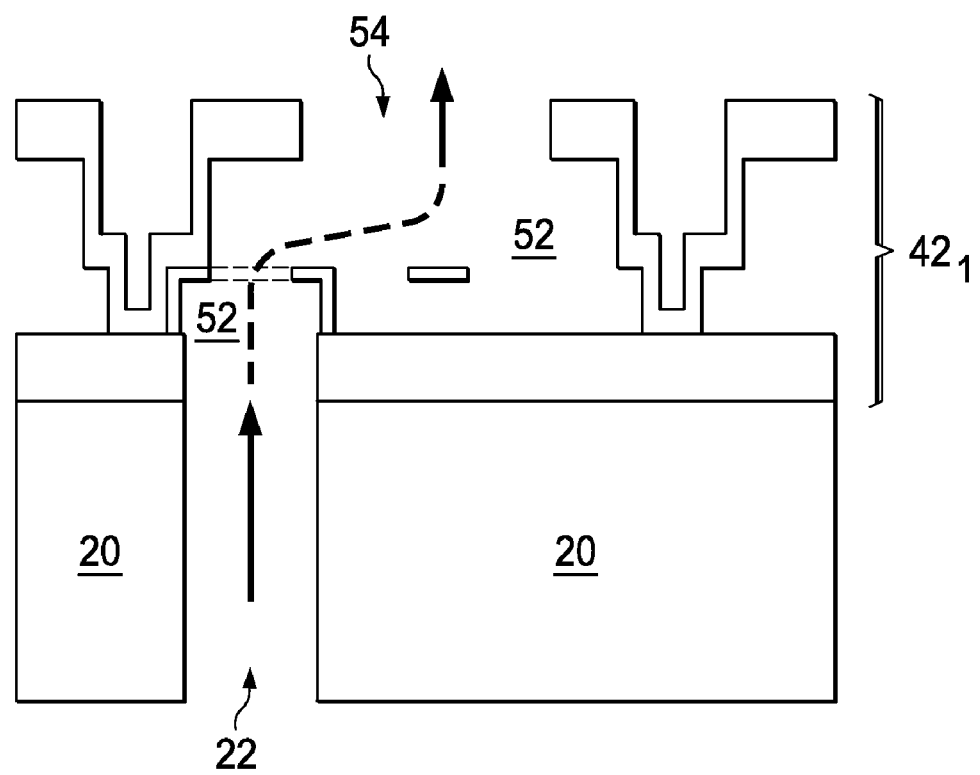
FIG. 17 illustrates a cross-sectional view of a micro inkjet head incorporating the embodiment of the present invention.
Figure 18A:
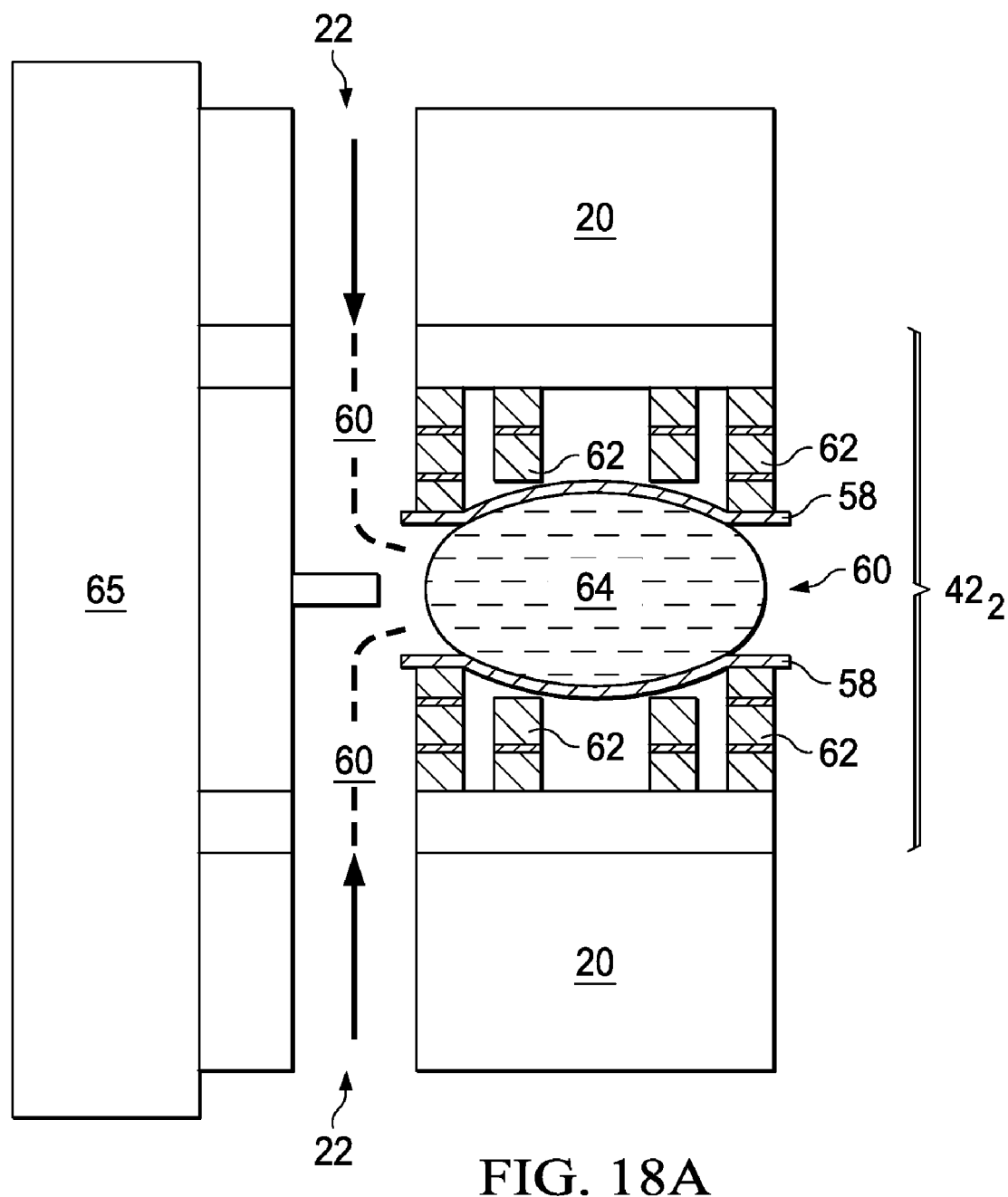
FIGS. 18A and 18B illustrate the operations of a micro flow pump incorporating the embodiment of the present invention.
Figure 18B:
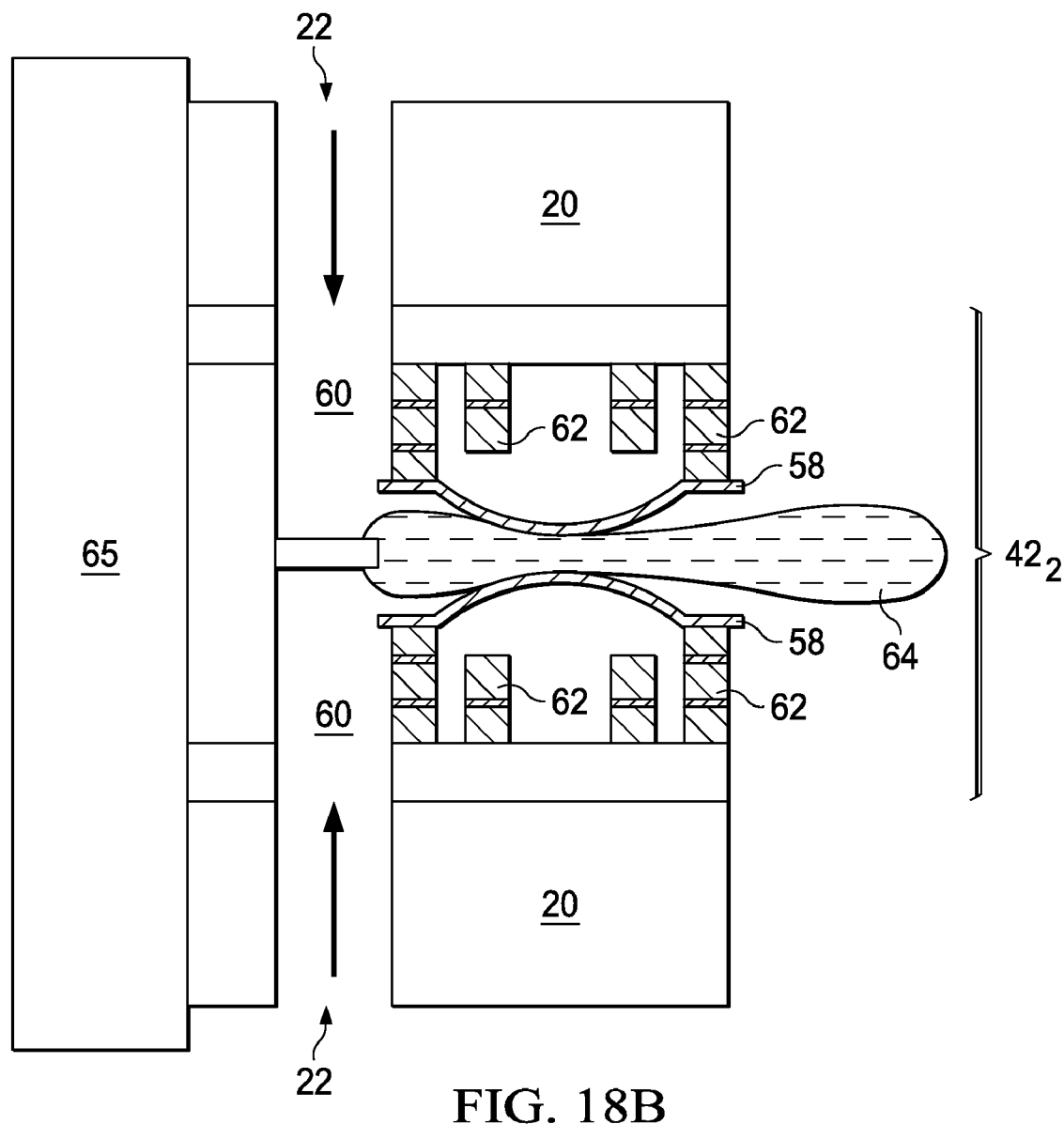

Next, as shown in FIG. 16, photo resists $30_1$, $36_1$, and $40_1$ in channel 22 are removed, leaving channel 22 unfilled. Please note that channel 22 may not be filled with any material such as dielectric materials or metals, even after the packaging of substrate 22, as is shown in FIGS. 17, 18A and 18B. Advantageously, since removing photo resist is significantly easier than etching substrate 20, the process is easier to control. Further, since the shape and location of channel 22 is defined from the front side of substrate 20, on which side MEMS device 42 is located, the likelihood of having a misalignment between MEMS device 42 and channel 22 is significantly reduced, and possibly substantially eliminated.

In alternative embodiments, instead of photo resists, other types of filling materials may be used to fill channel 22. The filling materials may include, for example, spin-on glass, dielectric materials formed using chemical vapor deposition (CVD) methods such as sub-atmospheric CVD, or the like. Again, after the backside of substrate 20 is etched, the filling material is etched similar to the removal of photo resists from channel 22.

In the resulting structure, as is also illustrated in FIG. 4A, channel 22 has width W1 on the side closer to MEMS device 42, and width W2 on the side farther away from MEMS device 42, and due to the nature of the formation process of channel 22, W1 is most likely to be greater than W2.

The embodiments of the present invention may be combined with various MEMS devices. FIG. 17 illustrates micro inkjet head $42_1$, which is used for emitting ink. The ink may be stored in storage 52. The ink may be pumped into storage 52 through channel 22, and then emitted out of storage 52 through outlet 54 by a membrane (not shown).

FIGS. 18A and 18B illustrate yet another application, in which channel 22 is connected to micro flow pump $42_2$, which may be used as a bio MEMS device. The embodiment shown in FIGS. 18A and 18B is used to emit fluid 64. In this embodiment, two substrates 20, each comprising a channel 22, are mounted against each other, and may be mounted on package substrate 65. Membranes 58 are placed facing each other, with the space between membranes 58 forming fluid storage 60. By applying a voltage to charge conductive posts 62 with charges having a different type than the charges on membranes 58, membranes 58 are attracted to conductive posts 62, and hence fluid 64 is injected into storage 60 through channels 22. When the voltages on conductive posts 62 are reversed, membranes 58 are pushed against each other, and hence fluid 64 is emitted, as shown in FIG. 18B.

The embodiments of the present invention have several advantageous features. The channels of the present invention may be formed with a high accuracy in alignment, wherein the depth of the channels no longer affects the accuracy of the alignment. Since the photo resist and the components of the MEMS devices are significantly different in etching characteristics, MEMS devices may have more choices as to the materials and structures, without the concern that the MEMS devices may be damaged by the formation of the channels.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
   providing a substrate;
   forming an opening in the substrate, wherein the opening extends from a top surface of the substrate into the substrate;
   filling a first layer of a photo resist into the opening;
   removing a portion of the first layer of the photo resist on the surface of the substrate;
   baking the first layer of the photo resist;
   filling a second layer of the photo resist into the opening and over the first layer of the photo resist, wherein at a time the second layer of the photo resist is filled into the opening, the second layer of the photo resist comprises more solvent therein than the first layer of the photo resist at a time the first layer of the photo resist is filled into the opening;
   removing an additional portion of the second layer of the photo resist on the surface of the substrate;
   baking the second layer of the photo resist;
   forming a micro-electro-mechanical-system (MEMS) device over the top surface of the substrate, wherein the MEMS device comprises an opening adjoining the first layer of the photo resist;
   grinding a backside of the substrate until the photo resist is exposed; and
   removing the photo resist from the opening.

2. The method of claim 1 further comprising:
   filling a third layer of the photo resist into the opening and over the second layer of the photo resist; and
   baking the third layer of the photo resist.

3. The method of claim 1, wherein the step of forming the opening comprises shaping a profile of the opening so that a first slant angle of a top portion of the opening is smaller than a second slant angle of a bottom portion of the opening.

4. The method of claim 1, wherein the MEMS device is selected from the group consisting essentially of a micro flow pump and an inkjet head.

5. The method of claim 1, wherein the second layer of the photo resist has a top surface substantially leveling the top surface of the substrate.

6. The method of claim 1, wherein at the time the first layer of the photo resist is filled into the opening, the first layer of the photo resist does not comprise the solvent as in the second layer of the photo resist.

7. The method of claim 1, wherein the device further comprises a storage opening adjoining the opening.

8. The method of claim 7, wherein the device is a micro-electro-mechanical system (MEMS) device for emitting a fluid, and wherein the opening and the storage opening are configured to conduct the fluid.

9. The method of claim 1, wherein the substrate is a semiconductor substrate.

* * * * *